(12) United States Patent
LaMeres et al.

(10) Patent No.: US 7,145,352 B2
(45) Date of Patent: Dec. 5, 2006

(54) APPARATUS, METHOD, AND KIT FOR PROBING A PATTERN OF POINTS ON A PRINTED CIRCUIT BOARD

(75) Inventors: Brock J. LaMeres, Colorado Springs, CO (US); Brent Holcombe, Colorado Springs, CO (US); Kenneth Johnson, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/918,134

(22) Filed: Aug. 13, 2004

(65) Prior Publication Data

US 2006/0033513 A1 Feb. 16, 2006

(51) Int. Cl.
*O01R 31/02* (2006.01)
*G01R 33/00* (2006.01)
*G01R 31/26* (2006.01)

(52) U.S. Cl. .................. 324/754; 324/758; 324/761; 439/638; 439/296

(58) Field of Classification Search ............... 324/754, 324/758; 439/296, 638
See application file for complete search history.

(56) References Cited

U.S. PATENT DOCUMENTS

| 5,818,248 | A * | 10/1998 | St. Onge | .................... 324/761 |
|---|---|---|---|---|
| 6,194,908 | B1 * | 2/2001 | Wheel et al. | .................... 324/761 |
| 6,359,452 | B1 * | 3/2002 | Mozzetta | .................... 324/754 |
| 2003/0210067 | A1 * | 11/2003 | Miller | .................... 324/765 |

OTHER PUBLICATIONS

Brent A. Holcombe, et al., Connector-Less Probe, U.S. Appl. No. 10/373,820, filed Feb. 25, 2003.
Brent A. Holcombe, et al., "Alignment/Retention Device for Connector-Less Probe", U.S. Appl. No. 10/644,365, filed Aug. 20, 2003.
Brock J. LaMeres, et al., "Backside Attach Probe, Components thereof, and Methods for Making and Using Same", U.S. Appl. No. 10/902,405, filed Jul. 28, 2004.
Brock J. LaMeres, et al., "Probes with Perpendicularly Disposed Spring Pins, and Methods of Making and Using Same", U.S. Appl. No. 10/781,086, filed Feb. 17, 2004.
Brock J. LaMeres, et al., "Probe Retention Kit, and System and Method for Probing a Pattern of Points on a Printed Circuit Board", U.S. Appl. No. 10/918,236 (17 pages of specification including claims and abstract, and five (5) sheets of formal drawings (Figs. 1-10), Filed Aug. 13, 2004.

\* cited by examiner

*Primary Examiner*—Ha Tran Nguyen
*Assistant Examiner*—Emily Y Chan

(57) ABSTRACT

An apparatus, method, and kit for probing a pattern of points on a first printed circuit board are disclosed. In one exemplary embodiment, the apparatus includes a probe having i) a plurality of compression interconnects to probe the pattern of points on the first printed circuit board, and ii) a plurality of fixed pins that are electrically coupled to the compression interconnects. The fixed pins extend from the probe opposite the compression interconnects. The apparatus further includes a flexible wire interconnect having first and second sets of electrically coupled connectors, the first set of which is coupled to the fixed pins of the probe. A second printed circuit board has at least one first connector that is electrically coupled to at least one second connector. The at least one first connector is coupled to the second set of connectors of the flexible wire interconnect, and the at least one second connector is configured to couple to a test instrument.

13 Claims, 5 Drawing Sheets

APPARATUS, METHOD, AND KIT FOR PROBING A PATTERN OF POINTS ON A PRINTED CIRCUIT BOARD

BACKGROUND

Connector-less probing has emerged as an attractive form of probing for logic analyzers and other test equipment. In connector-less probing, a customer may design their printed circuit board (PCB) to incorporate a "landing pattern" of test points. The customer then attaches a connector-less probe to their test equipment, and mounts the connector-less probe to their PCB so that a plurality of spring-pins on the probe engage the plurality of test points in their PCB's landing pattern.

One embodiment of a connector-less probe is disclosed in the United States patent application of Brent A. Holcombe, et al. entitled "Connector-Less Probe" (Ser. No. 10/373,820, filed Feb. 25, 2003). An alignment/retention device for mounting a connector-less probe to a PCB is disclosed in the United States patent application of Brent A. Holcombe, et al. entitled "Alignment/Retention Device For Connector-Less Probe" (Ser. No. 10/644,365, filed Aug. 20, 2003).

Connector-less probes for probing a plurality of breakout vias on the backside of a printed circuit board to which a grid array package is attached are disclosed in the United States Patent Application of Brock J. LaMeres, et al. entitled "Backside Attach Probe, Components Thereof, and Methods for Making and Using Same" (Attorney Docket Number 10030947-1, filed on the same date as this application). This application is related to another United States Patent Application of Brock J. LaMeres et. al., filed on the same date as this application, and entitled, "Probe Retention Kit, System, and Method for Probing A Pattern of Points on a Printed Circuit Board."

Agilent Technologies, Inc. (headquartered in Palo Alto, Calif.) markets a number of connector-less probing solutions under the name "Soft Touch".

SUMMARY

In one embodiment, apparatus for probing a pattern of points on a first printed circuit board comprises a probe, a flexible wire interconnect, and a second printed circuit board. The probe has i) a plurality of compression interconnects to probe the pattern of points on the first printed circuit board, and ii) a plurality of fixed pins that are electrically coupled to the compression interconnects. The fixed pins extend from the probe opposite the compression interconnects. The flexible wire interconnect has first and second sets of electrically coupled connectors, the first set of which is coupled to the fixed pins of the probe. The second printed circuit board has at least one first connector that is electrically coupled to at least one second connector, with the at least one first connector being coupled to the second set of connectors of the flexible wire interconnect, and the at least one second connector being configured to couple to a test instrument.

In another embodiment, a method for probing a pattern of points on a first printed circuit board comprises electrically coupling a plurality of compression interconnects, held by a probe, to the pattern of points. A plurality of damped wire accessories are electrically coupled to a plurality of fixed pins of the probe (the fixed pins being coupled to the compression interconnects). A plurality of flying lead cables are electrically coupled to the plurality of damped wire accessories, with each flying lead cable being coupled to at least two of the damped wire accessories. The plurality of flying lead cables are electrically coupled to a second printed circuit board. The second printed circuit board is electrically coupled to a test instrument.

In yet another embodiment, a kit for probing a pattern of points on a first printed circuit board comprises a probe, a plurality of damped wire accessories, and a plurality of flying lead cables. The probe has i) a plurality of compression interconnects to probe the pattern of points on the first printed circuit board, and ii) a plurality of fixed pins that are electrically coupled to the compression interconnects. The fixed pins extend from the probe opposite the compression interconnects. Each of the plurality of damped wire accessories has first and second electrically coupled connectors, the first of which is configured to couple to one of the fixed pins of the probe. Each of the plurality of flying lead cables has first and second electrically coupled connectors, the first of which is configured to couple to at least two of the second connectors of the damped wire accessories. The second printed circuit board has at least one first connector that is electrically coupled to at least one second connector, with the at least one first connector being configured to couple to the second connectors of the flying lead cables, and the at least one second connector being configured to couple to a test instrument.

Other embodiments of the invention are also disclosed.

BRIEF DESCRIPTION OF THE DRAWINGS

Illustrative and presently preferred embodiments of the invention are illustrated in the drawings, in which:

FIG. 5 illustrates an exemplary method for probing a pattern of points on a PCB.

DESCRIPTION OF THE INVENTION

After loading a printed circuit board (PCB 100) with a number of components 102, the loaded board must be tested. At times, an engineer may conduct tests by probing a pattern of points 104 on the PCB 100.

Figure 1:
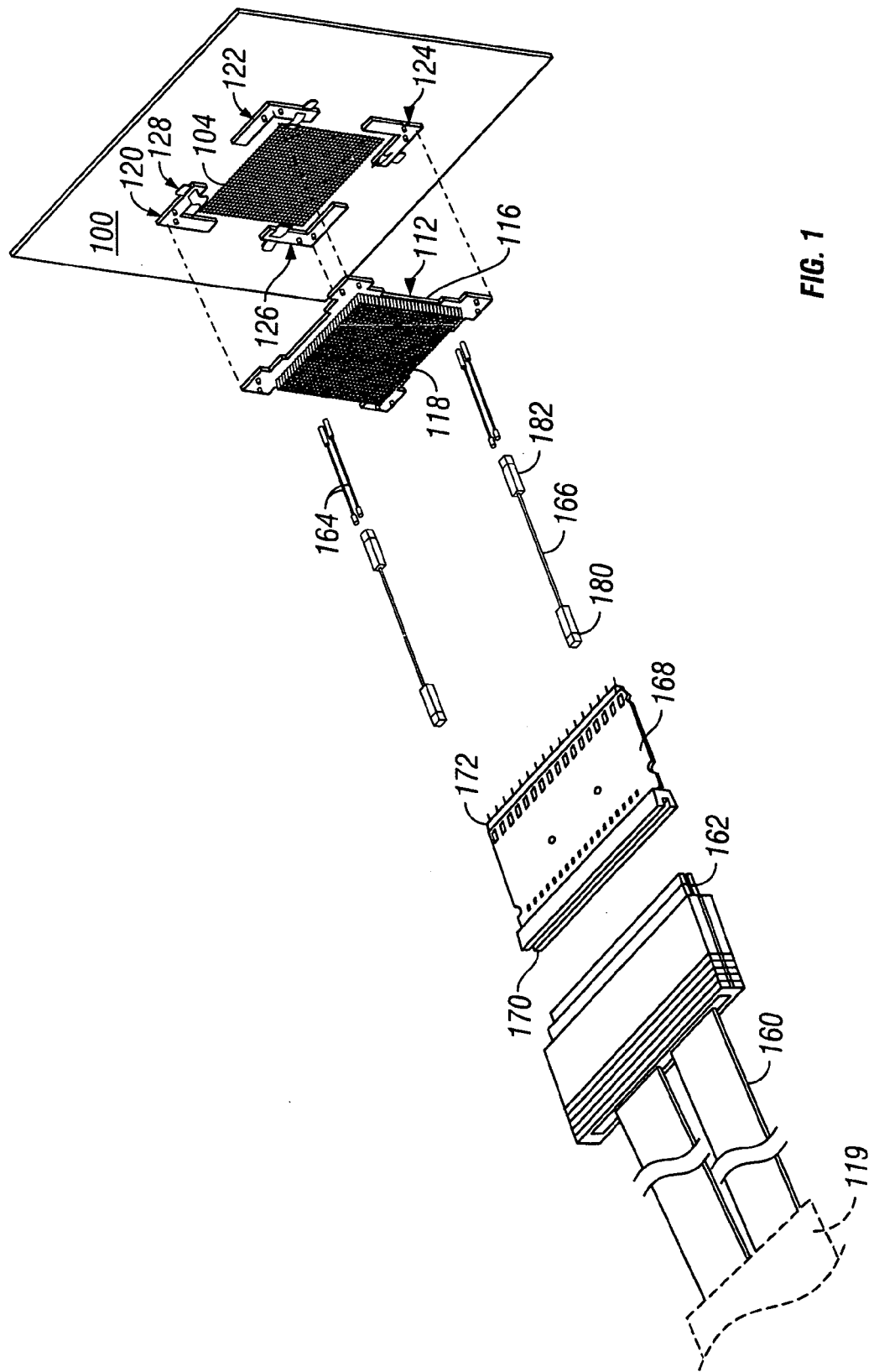
FIGS. 1 & 2 illustrate the assembly of an exemplary system for probing a pattern of points on a PCB.
Figure 2:
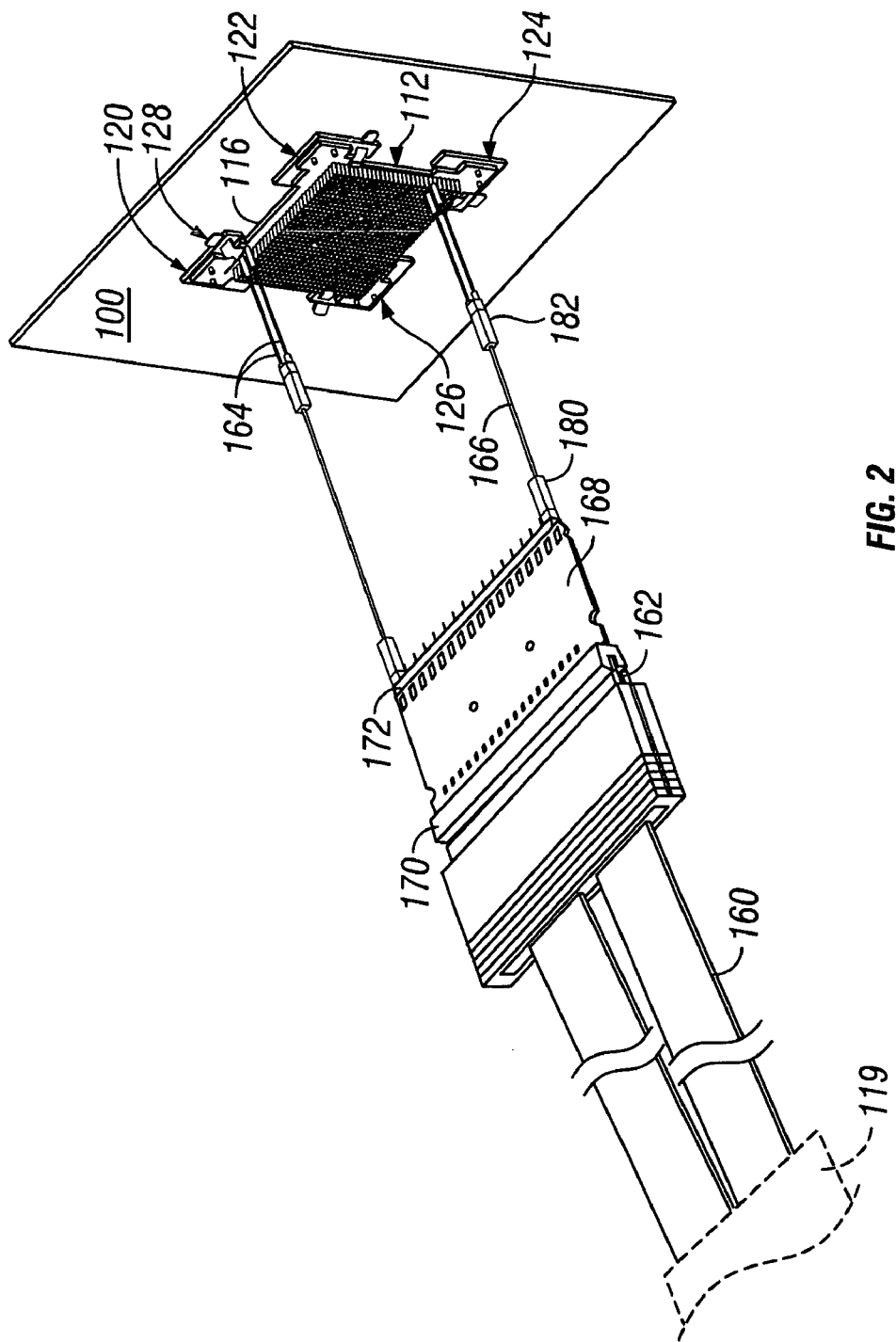
Figure 3:
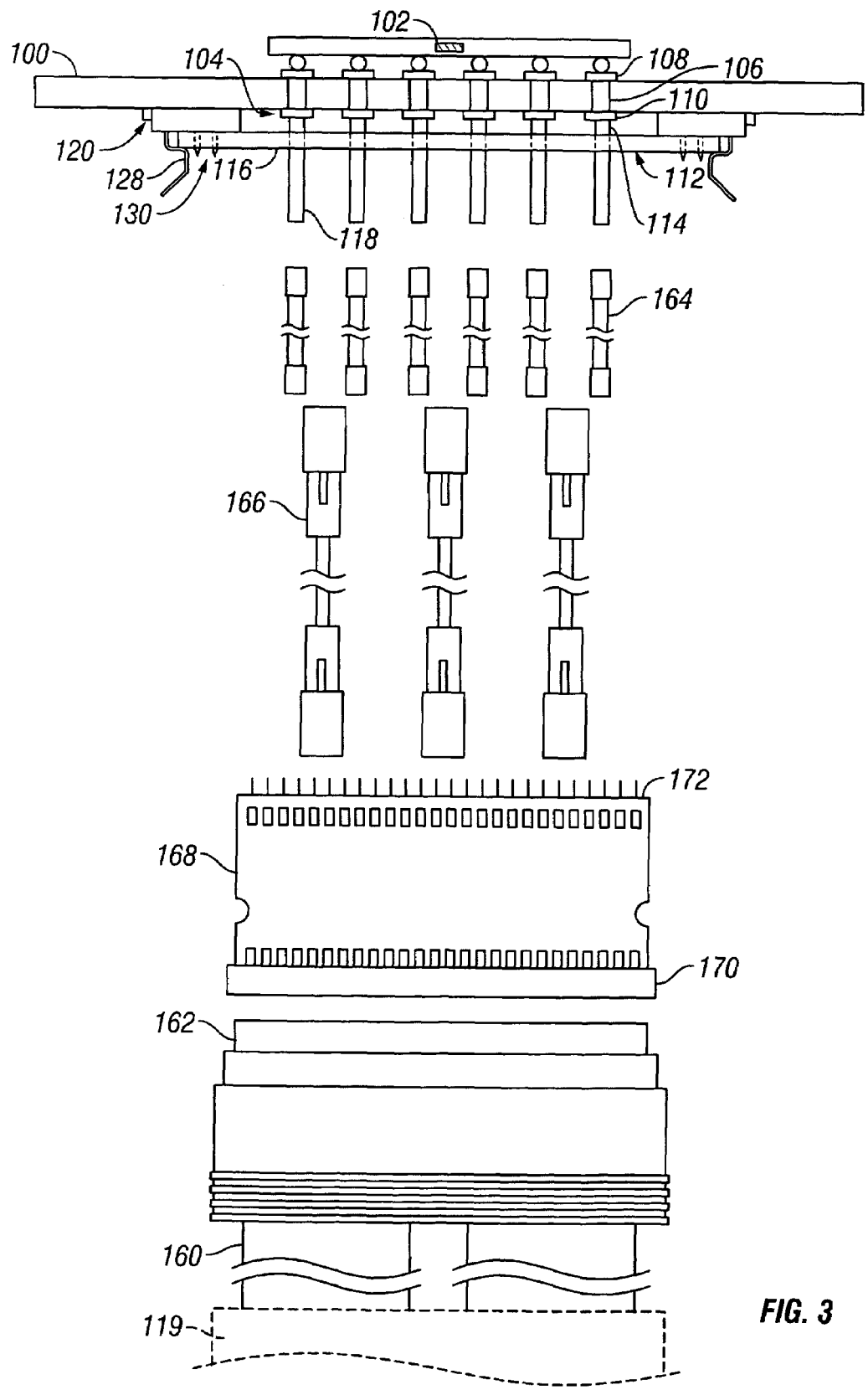
FIGS. 3 & 4 illustrate the assembly of the system shown in FIGS. 1 & 2, but from an elevation perspective.
Figure 4:
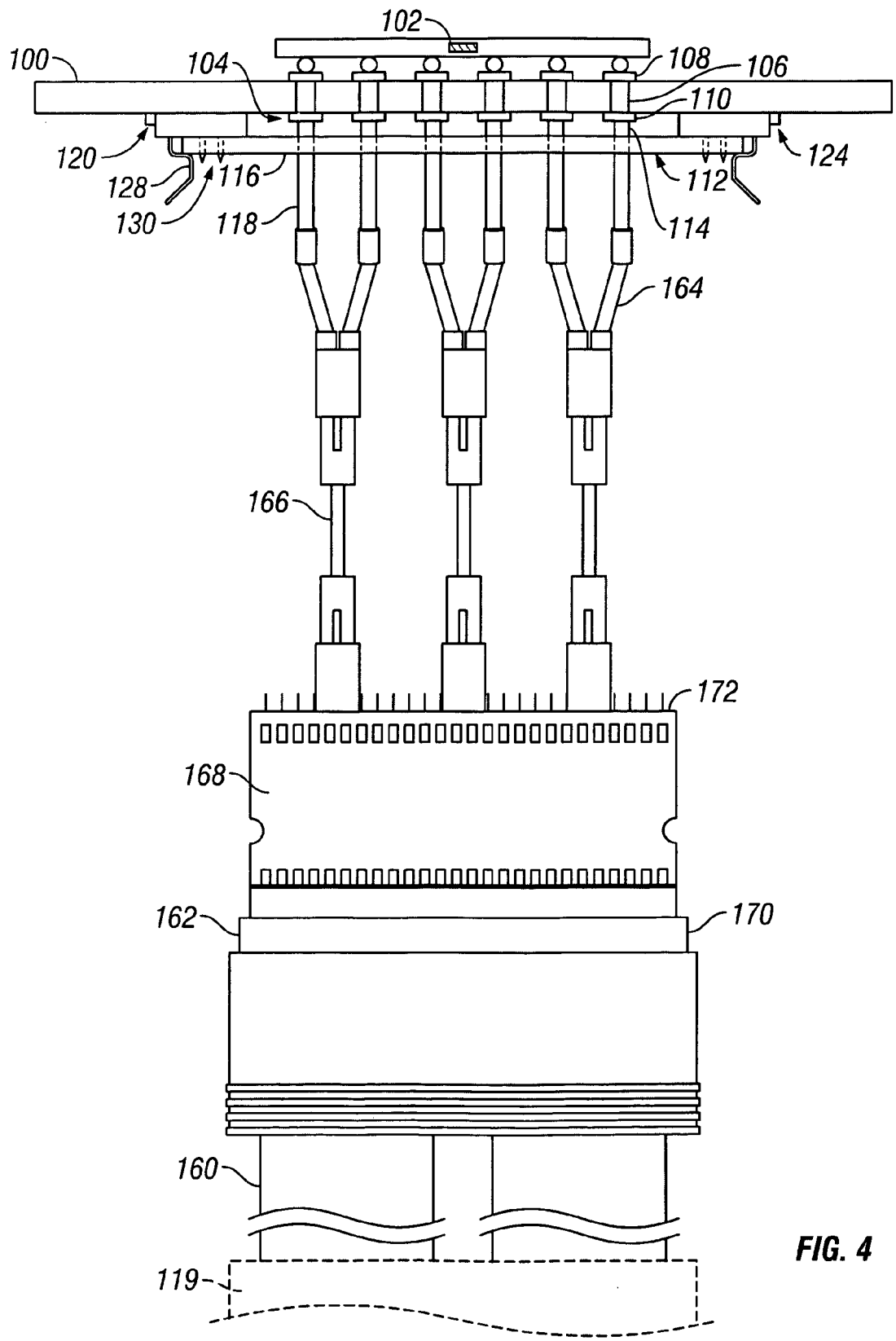

An exemplary pattern of points 104 is variously shown in each of FIGS. 1–4. As shown in FIGS. 3 & 4, the pattern of points 104 may be positioned on a PCB 100 opposite the side to which a component 102 such as an integrated circuit (IC) is attached. Alternately, the pattern of points 104 could be 1) positioned on the same side of the PCB 100 as the component 102, or 2) coupled to other and/or different components.

By way of example, the pattern of points 104 shown in FIGS. 3 & 4 is coupled to the IC 102 by means of breakout vias (e.g., 106) in the PCB 100. For purposes of illustration, each of the breakout vias 106 is shown to be bounded above and below by a somewhat thick pad (e.g., 108, 110). Typically, however, these pads 108, 110 will be very thin.

One way to probe a pattern of points 104 on a PCB 100 is via a probe 112 having a plurality of compression interconnects (e.g., 114) therein. As shown in FIG. 1–4, such a probe 112 may generally comprise a substrate 116 formed of an insulating material (e.g., plastic or FR4). The probe's compression interconnects 114 may then be molded, press fitted, snapped, clipped, screwed, soldered or otherwise secured in its substrate 116 so that they are maintained in a pattern that corresponds to the pattern of points 104 to be probed.

The compression interconnects 114 of a probe 112 may take the form of any of a number of different electrically conductive and compressible devices (or materials). In FIGS. 1–4, the compression interconnects 114 take the form of spring pins with crowned tips. However, the compression interconnects could also take the form of c-springs or conductive elastomers.

Coupled to (or extending from) each compression interconnect 114 is a fixed pin (e.g., 118) that extends from the surface of the probe substrate 116 opposite the compression interconnects 114. The fixed pins 118 provide a means for coupling leads or cables 160 of a test instrument, such as a test instrument 119 as shown in phantom in FIGS. 1–4 and 6, to the compression interconnects 114.

By way of example, a number of additional probes containing compression interconnects are disclosed in the United States Patent Application of Brock J. LaMeres, et al. entitled "Backside Attach Probe, Components Thereof, and Methods for Making and Using Same" (Attorney Docket Number 10030947-1 filed on Jul. 28, 2004).

In use, the compression interconnects 114 of a probe 112 are aligned with a pattern of points 104 to be probed, and pressure is applied to the probe 112 to seat the compression interconnects 114 against the pattern of points 104 (see FIGS. 2 & 4).

Depending on the pattern of points 104 to be probed, the required number and placement of compression interconnects 114 in a probe 112 will vary. Different applications therefore require the development of different sizes and shapes of probes.

To maintain compression on its compression interconnects 114, thereby assuring that its compression interconnects 114 remain firmly seated against a pattern of points 104 to be probed, a probe 112 typically needs to be secured to a PCB 100. This may be accomplished via a connector or bracket of fixed size that is attached to the PCB 100 or, as shown in FIGS. 1–4, by a plurality of probe retention devices 120, 122, 124, 126, each having a retention mechanism (e.g., 128) and an alignment mechanism (e.g., 130). The probe retention devices 120, 122, 124, 126 are mechanically coupled to positions adjacent a pattern of points 104 on a PCB 100. The probe retention devices 120–126 may be coupled to the PCB 100 by, for example, clipping, snapping, soldering, screwing, or press fitting them into the PCB 100. The alignment mechanism 130 (e.g., pins) is then used to align the probe 112 with the pattern of points 104 prior to the probe substrate 116 being engaged with (and retained by) the retention mechanism 128. Further details on the construction and use of probe retention devices 120–126 are found in the United States Patent Application of Brock J. LaMeres et. al., filed on the same date as this application, entitled "Probe Retention Kit, and System and Method for Probing A Pattern of Points on a Printed Circuit Board."

Either before or after the probe 112 is secured to the PCB 100, its fixed pins 118 must be electrically coupled to a test instrument, such as test instrument 119 (e.g., a logic analyzer or oscilloscope). Typically, a connection cable 160 will be provided for a test instrument, such as test instrument 119. However, the connection cable 160 usually terminates at a connector 162, and the numerous different configurations of compression interconnects 114 and fixed pins 118 of probe 112 makes a direct connection between probe 112 and the test equipment cable 160 impractical. FIG. 5 therefore provides an exemplary method 500 for probing a pattern of points 104 on a PCB 100. As a byproduct of the method 500, the PCB 100 is electrically coupled to a test equipment cable 160.

The method 500 comprises electrically coupling 502 a plurality of compression interconnects 114, held by a probe 112, to a pattern of points 104 on a PCB 100. A plurality of damped wire accessories 164 are then electrically coupled 504 to a plurality of fixed pins 118 of the probe 112, with the fixed pins 118 being coupled to the compression interconnects 114. By way of example, each damped wire accessory 164 may be terminated at one or both ends via a damping impedance (e.g., a resistor) or impedance network.

Next, a plurality of flying lead cables 166 are electrically coupled 506 to the plurality of damped wire accessories 164. Each flying lead cable 166 is coupled to at least two of the damped wire accessories 164. Each flying lead cable 166 is also coupled 508 to a second PCB 168. In one embodiment, the flying lead cables 166 may take the form of coaxial cables. In another embodiment, the flying lead cables 166 may take the form of leads provided in Agilent Technologies, Inc.'s E2668A InfiniiMax Single-ended Connectivity Kit.

To finish the method 500, the second PCB 168 is electrically coupled 510 to a test instrument, such as test instrument 119. One of ordinary skill in the art will appreciate that the steps 502–510 of the method 500 are interchangeable in order, and the order specified in FIG. 5 represents only one exemplary order. Operation of the method 500 is best understood by referring to the system and apparatus shown in FIGS. 1–4.

Note that the connectors 170, 172 of the second PCB 168 may take a variety of forms. For example, the flying lead cables 166 may attach to a single connector 172 (e.g., an edge connector) of the second PCB 168, or to multiple connectors that receive ones or groups of the flying lead cables 166. Similarly, a test equipment cable 160 may comprise one or more connectors 162 (e.g., edge connectors), thus requiring one or more corresponding connectors 170 on the second PCB 168. Of note, different configurations of test equipment cable(s) 160 only require the construction of different second (or intermediate) PCBs 168 to be used with the solution described herein. All other components can be used with various different intermediate PCBs.

Figure 6:
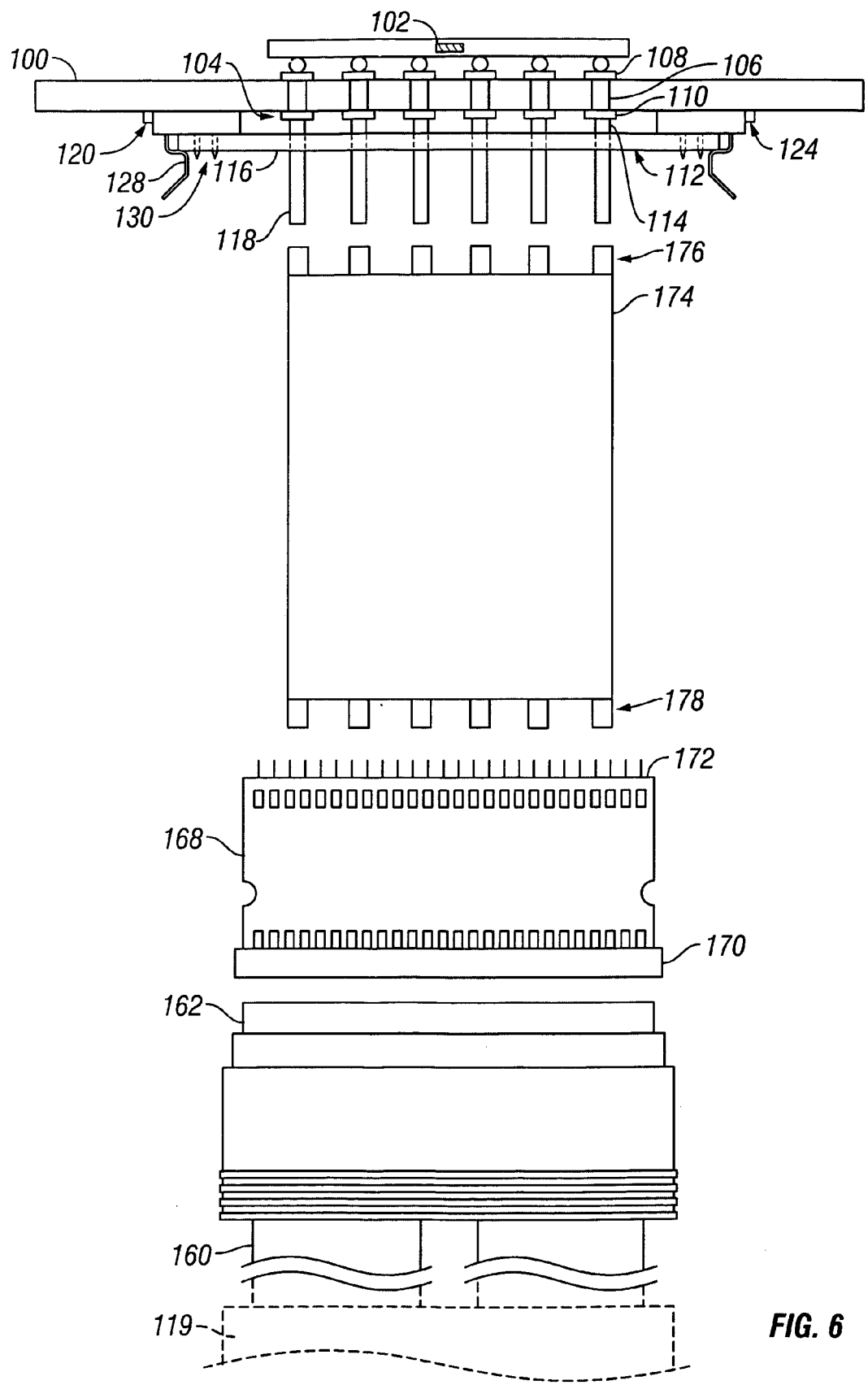
FIG. 6 illustrates an elevation of a second exemplary apparatus for probing a pattern of points on a PCB.

Although the method 500 discloses the electrical coupling of a probe 112 and second PCB 168 via damped wire accessories 164 and flying lead cables 166, these items 164, 166, generically, form a flexible wire interconnect 174 (see FIG. 6). In generic form, the flexible wire interconnect 174 comprises first and second sets of electrically coupled connectors 176, 178. Although the flexible wire interconnect 174 can take the form of two or more electrically coupled but detachable tiers of cables (e.g., damped wire accessories 164 and flying lead cables 166), the flexible wire interconnect 174 could also take other forms, such as forms with more cable tiers or different joinders between cables.

As known in the art, the probes or leads of modern test instruments (such as logic analyzers or oscilloscopes, for example) typically comprise a tip network. The tip network usually comprises a tip capacitor and tip resistor that form a compensated resistive-divider circuit with the termination impedance of a test instrument. The electrical loading on signals being probed can be reduced by placing the tip network as close as possible to a target signal (i.e., a signal being probed). Placing the tip network closer to a target signal also increases the quality of signals that are sensed by a test instrument (e.g., by reducing signal reflections and "ringing"). However, spatial and capacitive loading problems often make it difficult to place the tip capacitor and tip resistor (which is often on the order of 20 kΩ) as close to the target signal as desired. As a result, the tip network will sometimes also comprise an isolation resistor (see, for example, resistors R or R2 in FIG. 3, or resistors R3 in FIG. 6). The value of this isolation resistor may be on the order of 125 Ω. Being of smaller size than the tip resistor, and being one component instead of two, the isolation resistor can often be placed much closer to a target signal than the tip capacitor and tip resistor. In the probing solution disclosed herein, such an isolation resistor may be incorporated into each flying lead cable 166 (e.g., the resistors R2) or damped wire accessory 164 (e.g., the resistors R). If incorporated into a flying lead cable 166, it may be placed on a PCB that is integrated with one of the connectors 180, 182 of the flying lead cable 166. In FIG. 6, isolation resistors R3 are incorporated into the flexible wiring interconnect 174.

What is claimed is:

1. Apparatus for probing a pattern of points on a first printed circuit board, comprising:
    a probe having i) a plurality of compression interconnects to probe the pattern of points on the first printed circuit board, and ii) a plurality of fixed pins that are electrically coupled to the compression interconnects, the compression interconnects and the fixed pins extending from the probe in opposite directions;
    a flexible wire interconnect having first and second sets of electrically coupled connectors, the first set of which is coupled to the fixed pins of the probe; and
    a second printed circuit board having at least one first connector that is electrically coupled to at least one second connector, the at least one first connector being coupled to the second set of connectors of the flexible wire interconnect, and the at least one second connector being configured to electrically couple to a test instrument.

2. The apparatus of claim 1, wherein the flexible wire interconnect further comprises:
    a plurality of damped wire accessories, each having first and second electrically coupled connectors, the first of which forms part of the first set of connectors of the flexible wire interconnect; and
    a plurality of flying lead cables, each having first and second electrically coupled connectors, the first of which is coupled to at least two of the second connectors of the damped wire accessories, and the second of which forms part of the second set of connectors of the flexible wire interconnect.

3. The apparatus of claim 2, wherein at least one of the damped wire accessories comprises an isolation resistor.

4. The apparatus of claim 2, wherein at least one of the flying lead cables comprises an isolation resistor.

5. The apparatus of claim 2, wherein each of the flying lead cables comprises a coaxial cable.

6. The apparatus of claim 1, wherein the flexible wire interconnect comprises an isolation resistor.

7. The apparatus of claim 1, wherein the flexible wire interconnect comprises two or more electrically coupled but detachable tiers of cables.

8. The apparatus of claim 1, wherein the at least one second connector of the second printed circuit board consists of a single edge connector.

9. A method for probing a pattern of points on a first printed circuit board, comprising:
    electrically coupling a plurality of compression interconnects, held by a probe, to the pattern of points;
    electrically coupling a plurality of damped wire accessories to a plurality of fixed pins of the probe, the fixed pins being coupled to the compression interconnects;
    electrically coupling a plurality of flying lead cables to the plurality of damped wire accessories, with each flying lead cable being coupled to at least two of the damped wire accessories;
    electrically coupling the plurality of flying lead cables to a second printed circuit board; and
    electrically coupling the second printed circuit board to a test instrument.

10. A kit for probing a pattern of points on a first printed circuit board, comprising:
    a probe having i) a plurality of compression interconnects to probe the pattern of points on the first printed circuit board, and ii) a plurality of fixed pins that are electrically coupled to the compression interconnects, the compression interconnects and the fixed pins extending from the probe in opposite directions;
    a plurality of damped wire accessories, each having first and second electrically coupled connectors, the first of which is configured to couple to one of the fixed pins of the probe;
    a plurality of flying lead cables, each having first and second electrically coupled connectors, the first of which is configured to couple to at least two of the second connectors of the damped wire accessories; and
    a second printed circuit board having at least one first connector that is electrically coupled to at least one second connector, the at least one first connector being configured to couple to the second connectors of the flying lead cables, and the at least one second connector being configured to electrically couple to a test instrument.

11. The kit of claim 10, wherein at least one of the damped wire accessories comprises an isolation resistor.

12. The kit of claim 10, wherein at least one of the flying lead cables comprises an isolation resistor.

13. The kit of claim 10, wherein each of the flying lead cables comprises a coaxial cable.

* * * * *